(12) United States Patent
Vyne et al.

(10) Patent No.: US 6,300,833 B1
(45) Date of Patent: Oct. 9, 2001

(54) DC GAIN ENHANCEMENT FOR OPERATIONAL AMPLIFIERS

(75) Inventors: Robert L. Vyne, Tempe; Chad Traylor, Chandler, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/449,996

(22) Filed: Dec. 26, 1999

(51) Int. Cl.[7] .................................. H03F 3/45; H03F 1/36
(52) U.S. Cl. ........................ 330/257; 330/85; 330/255; 330/260
(58) Field of Search ........................ 330/85, 255, 257, 330/260

(56) References Cited

U.S. PATENT DOCUMENTS

| | | | |
|---|---|---|---|
| 4,267,517 | * | 5/1981 | Iida et al. .............................. 330/253 |
| 4,642,551 | * | 2/1987 | Miller .................................... 330/257 |
| 4,743,862 | * | 5/1988 | Scheinberg ............................ 330/257 |
| 5,166,637 | * | 11/1992 | Wurcer .................................. 330/257 |
| 5,952,882 | * | 9/1999 | Kolluri .................................. 330/255 |

* cited by examiner

*Primary Examiner*—Robert Pascal
*Assistant Examiner*—Patricia T. Nguyen
(74) *Attorney, Agent, or Firm*—Robert D. Atkins; Michael T. Wallace

(57) ABSTRACT

A self compensating operational amplifier (10) including a differential amplifier input stage (18) and a current mirror (24) having an input and an output coupled to the respective outputs (20, 22) of the differential amplifier input stage is provided that uses a feedback amplifier (28) which senses any voltages differences between the input and outputs of the current mirror as current is sourced or sank at the output (32) of the operational amplifier. The feedback amplifier produces a feedback current to the input side (20) of the current mirror wherein the voltage at the input side of the current mirror tracks the voltage swing at the output side of the current mirror so that the voltages track and are substantially matched.

27 Claims, 2 Drawing Sheets

US 6,300,833 B1

DC GAIN ENHANCEMENT FOR OPERATIONAL AMPLIFIERS

BACKGROUND OF THE INVENTION

The present invention relates, in general, to operational amplifiers and, more particularly, to a method and structure for enhancing the gain while reducing the input offset voltage of typical operational amplifiers.

Operational amplifiers generally comprise a first gain stage followed by an output stage the latter of which drives a load coupled to the output of the operational amplifier. The first gain stage includes at least an input differential amplifier stage the differential outputs of which drive a current mirror. The current mirror converts the differential outputs of the input differential amplifier to a single-ended output that drives the output stage.

The direct current (DC) gain of the aforesaid operational amplifier is typically limited by the voltage swing developed at the output of the first gain stage. Usually this voltage swing occurs at the output of the current mirror. This voltage swing causes a small current to be reflected back to the input differential amplifier due to the finite output impedance of the current mirror. This effect causes the input differential amplifier to correct for this imbalance which reduces the DC gain of the amplifier. CMOS transistor operational amplifiers are especially prone to this gain reduction due to the higher voltage swings necessary at the output of the first gain stage because of the low Gm of MOS transistors. Further, the output impedance of CMOS current mirrors is typically lower than for bipolar transistor current mirrors which will cause a greater current to be reflected to the input of the operational amplifier.

In view of the above, it would be advantageous to provide circuitry and a method for enhancing the DC gain and reducing the input offset voltage for operational amplifiers.

DETAILED DESCRIPTION OF THE DRAWINGS

Figure 1:
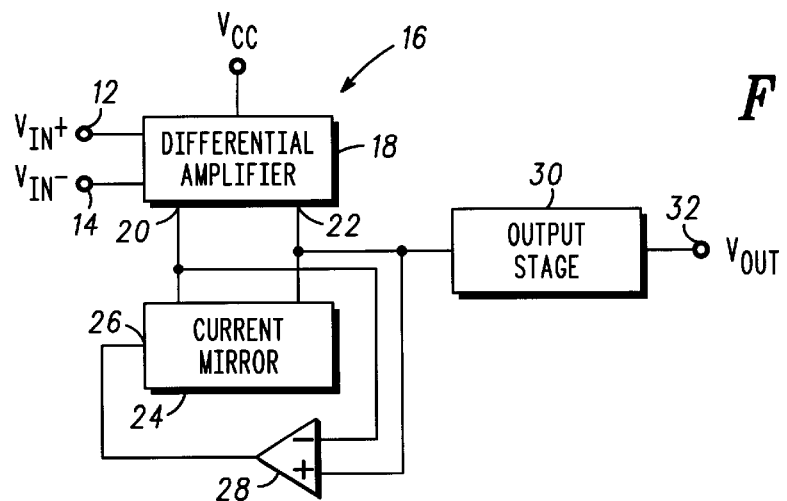
FIG. 1 is a block diagram of the operational amplifier of the present invention.

FIG. 1 is a block diagram of a self-compensating amplifier 10 of one embodiment of the disclosure shown as having two gain stages, i.e., an input stage 16 and an output stage 30. Self-compensating amplifier 10 receives differential signals $V_{IN-}$ and $V_{IN+}$ at respective terminals 12 and 14 and generates an amplified output signal VOUT at terminal 32. Input stage 16 includes a differential amplifier 18 and a current mirror 24. Differential amplifier 18 receives the differential signals VIN+ and VIN− and connections are made to the input and output of current mirror 24 through terminals 20 and 22 respectively.

Self-compensating amplifier 10 includes a feedback amplifier 28 having a non-inverting input connected to terminal 20 and an inverting input connected to terminal 22. The output of feedback amplifier 28 is connected to an input terminal 26 of current mirror 24. Output stage 30 has an input connected to terminal 22 and an output connected to terminal 32.

Figure 2:
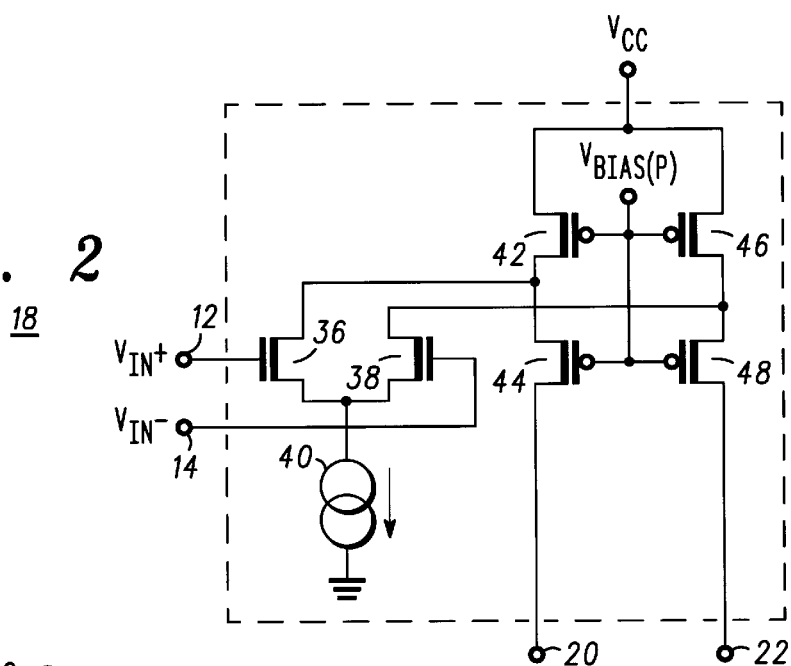
FIG. 2 is a schematic diagram of the differential amplifier input stage of FIG. 1.

FIG. 2 is a schematic diagram of differential amplifier 18 of FIG. 1 that includes N-channel MOS depletion mode transistors 36 and 38 that have gate terminals coupled to respective terminals 12 and 14 for receiving differential signals. It should be noted that the same reference numbers are used in the figures to denote the same elements. Transistors 36 and 38 have commonly connected source terminals that are also connected through a current source 40 to a first power conductor, to which a first operating potential is supplied,.

P-channel MOS transistors 42 and 46 have source terminals that are connected to each other to a second power conductor and receive a second operating potential, the power supply voltage $V_{CC}$. The drain terminal of transistor 42 is connected to the source terminal of P-channel MOS transistor 44 and further connected to the drain terminal of transistor 36. The drain terminal of transistor 46 is connected to the source terminal of P-channel MOS transistor 48 and further connected to the drain terminal of transistor 38. The commonly connected gate terminals of transistors 42, 44, 46, and 48 are coupled for receiving a bias voltage $V_{BIAS}$ (p). The drain terminals of transistors 44 and 48 are connected to terminals 20 and 22, respectively. Transistors 42, 44, 46, and 48 provide a folded cascoded connection to current mirror 24 as generally understood.

Figure 3:
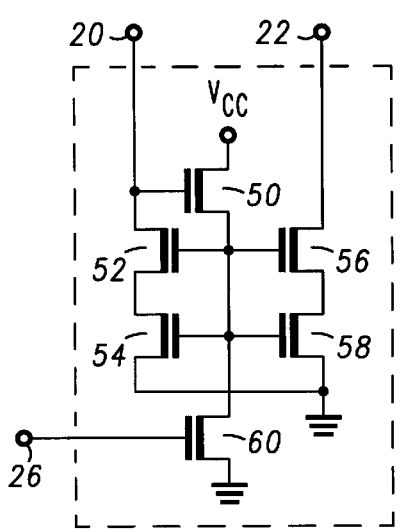
FIG. 3 is a schematic diagram of the current mirror of the input stage of the operational amplifier of FIG. 1.

FIG. 3 is a schematic diagram of current mirror 24 of FIG. 1 which establishes a signal at terminal 22 to the input of output gain stage 30. N-channel MOS transistors 52 and 56 have drain terminals that are connected to respective terminals 20 and 22. The source terminal of transistor 52 is connected to the drain terminal of N-channel transistor 54 and the source terminal of transistor 56 is connected to the drain terminal of N-channel transistor 58. The commonly connected source terminals of N-channel transistors 54 and 58 are coupled to the first power conductor. Transistors 52 and 56 are cascode transistors which increases the impedance at respective terminals 20 and 22. An N-channel MOS depletion mode transistor 50 has a gate terminal connected to terminal 20 and a drain terminal coupled for receiving a second source of operating potential $V_{CC}$. A source terminal of transistor 50 and a drain terminal of N-channel transistor 60 are commonly connected to the gate terminals of transistors 52 54, 56, and 58. The gate terminal of transistor 60 is connected to terminal 26, while the source terminal is coupled for receiving the operating potential $V_{EE}$.

Figure 4:
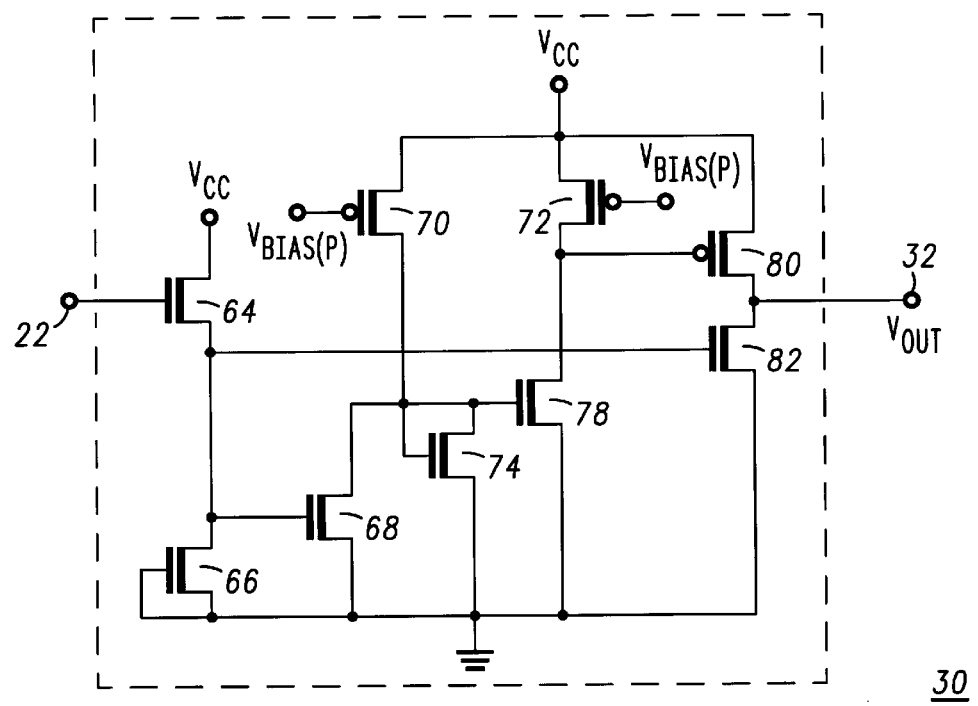
FIG. 4 is a schematic diagram of the output stage of the operational amplifier of FIG. 1.

FIG. 4 is a schematic diagram of output stage 30 of FIG. 1. The signal arising at the output of current mirror 24, at terminal 22, is received at the input of output stage 30 (the gate of N-channel transistor 64) and is amplified for providing the signal $V_{OUT}$ at terminal 32. The gate terminal of N-channel depletion mode transistor 64 is connected to terminal 22, while the drain terminal receives the operating potential $V_{CC}$. An N-channel depletion mode transistor 66 has a gate terminal and a source terminal commonly connected to a power conductor that receives the operating potential $V_{EE}$. The drain terminal of transistor 66 is connected to the source terminal of transistor 64.

The gate terminal of transistor 68 is connected to the source terminal of transistor 64. The commonly connected gate and drain terminals of N-channel transistor 74 are connected to the drain terminal of transistor 68. The source terminal of transistor 74 is coupled to the operating potential $V_{EE}$. A P-channel transistor 70 has a gate terminal coupled for receiving the bias voltage $V_{BIAS}(p)$, a source terminal that receives the operating potential $V_{CC}$, and a drain terminal that connects to the drain terminal of transistor 68.

The gate terminal of transistor 78 is connected to the drain terminal of transistor 68 and the source terminal receives the operating voltage $V_{EE}$. A P-channel transistor 72 forms a current source as does P-channel transistor 70. In particular, the gate terminal or electrode of transistor 72 is coupled to the bias voltage $V_{BIAS}(P)$ while its drain is coupled both to the gate of transistor 80 and the drain of transistor 78. The source terminals of transistors 72 and 80 receive the operating potential $V_{CC}$. The gate terminal of N-channel transistor 82 is connected to the source terminal of transistor 64. The source terminal of transistor 82 receives the operating voltage $V_{EE}$. The drain terminals of transistors 80 and 82 are connected to terminal 32 and supply the signal $V_{OUT}$ by either sourcing or sinking current at terminal 32 responsive to the differential input signals applied to inputs 12 and 14 of the operational amplifier 10.

Figure 5:
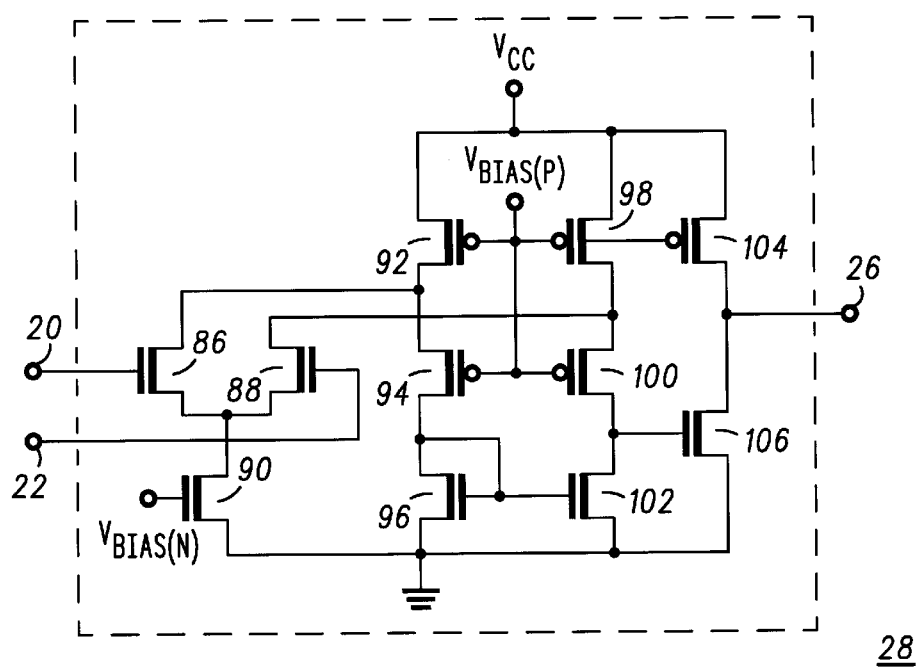
FIG. 5 is a schematic diagram of the feedback amplifier of the present invention.

FIG. 5 is a schematic diagram of amplifier 28 of FIG. 1. Amplifier 28 has a non-inverting input and an inverting input which receive signals from terminals 20 and 22, respectively. N-channel depletion mode transistors 86 and 88 have gate terminals coupled for receiving the differential signals from respective terminals 20 and 22.

Transistors 86 and 88 have commonly connected source terminals that are connected to a power conductor $V_{EE}$ through a N-channel transistor 90. The gate terminal of transistor 90 receives a bias voltage $V_{BIAS}(N)$.

P-channel transistors 92 and 98 have source terminals that receive the power supply voltage $V_{CC}$. The drain terminal of transistor 92 is connected to the source terminal of P-channel transistor 94 and further connected to the drain terminal of transistor 86. The drain terminal of transistor 98 is connected to the source terminal of P-channel transistor 100 and further connected to the drain terminal of transistor 88. The commonly connected gate terminals of transistors 92, 94, 98, and 100 are coupled for receiving a bias voltage $V_{BIAS}(P)$.

N-channel transistors 96 and 102 form a current mirror. The gate and drain terminals of transistor 96 are commonly connected to the gate terminal of transistor 102 and further connected to the drain terminal of transistor 94. The drain terminal of transistor 102 is connected to the drain terminal of transistor 100. The source terminals of transistors 96 and 102 are connected to the power a conductor $V_{EE}$. A P-channel transistor 104 has a gate terminal coupled for receiving the bias voltage $V_{BIAS}(P)$. The source terminal of transistor 104 is connected to the power supply conductor and receives the voltage $V_{CC}$. An N-channel transistor 106 has a gate terminal coupled to the drain terminal of transistor 102. The source terminal of transistor 106 is connected to the power supply conductor and receives the voltage $V_{EE}$. The drain terminals of transistors 104 and 106 are connected to terminal 26 and supply the feedback signal that is generated by amplifier 28.

In operation, referring to FIG. 1, self-compensating amplifier 10 provides two gain stages. Input stage 16 provides gain by generating a signal at terminal 22 based on the differential signals supplied at inputs 12 and 14.

Output stage 30 also provides gain by generating the signal $V_{OUT}$ based on the signal at terminal 22. When the magnitude of the signal at terminal 22 is greater than a particular voltage, output stage 30 sinks a current at terminal 32. On the other hand, when the magnitude of the signal at terminal 22 is less than the particular voltage, output stage 30 sources a current at terminal 32. Thus, output stage 30 sinks or sources current based on the magnitude of the signal at terminal 22 varying above and below a predetermined value. The general operation of amplifier 10, as above described, is well known to those skilled in the art.

The finite impedance at terminal 22 limits the gain of amplifier 10. As shown in FIGS. 2, 3 and 4, transistors 46, 48, 56, 58, and 64 have connections to terminal 22. Transistor 64, configured as a source follower, has its gate terminal connected to terminal 22 and produces a high impedance thereat relative to ground. However, a first current conduction path from terminal 22 to the power conductor that receives the voltage $V_{CC}$ is provided through the drain-to-source resistance of transistors 46 and 48. A second current conduction path from terminal 22 to the power conductor that receives the voltage $V_{EE}$ is provided through the output impedance set by transistors 56 and 58. As input stage 16 generates a voltage swing at terminal 22, currents are conducted through the first and second current conduction paths and if not compensated, limit the voltage gain of amplifier 10 while producing an input voltage offset due to the change in current through transistors 48 and 56.

The following will provide a brief explanation of the above-disclosed undesirable effects. Briefly, during operation of the operational amplifier, the voltage at node 20, if not compensated, remains substantially fixed due to the biasing of transistors 50, 54 and 58. Hence, this voltage does not track the variations in the voltage appearing at node 22. As the voltage $V_{GS}$ (gate-to-source) of transistor 82 changes in response to the input differential signals, thereby causing a current to be either sourced or sank at output 32, this voltage change is translated through source follower transistor 64 since its $V_{GS}$ doesn't substantially change. Therefore, as transistors 48 and 56 present a finite impedance, a delta current is created as the voltage at node 22 varies. This delta current has to be supplied by a change in the bias of transistor 36 and 38 of differential amplifier 18. Thus, the delta current created produces a large gain error of operational amplifier 10 while an input offset voltage is created between input transistors 36 and 38.

In order to overcome the imbalance of the voltages generated at nodes 20 and 22 as described above creating a delta current, feedback amplifier 28 is provided in accordance with the present invention. Briefly referring to FIG. 1, amplifier 28 detects voltage imbalances that exist at terminal 20 with respect to terminal 22. Amplifier 28 generates a feedback signal at input 26 of current mirror 24 that compensates for the voltage imbalances and adjusts the voltage at terminal 20 to substantially match the voltage at terminal 22. By matching the voltages at terminals 20 and 22, the delta currents are equal on both sides of current mirror 24, i.e., the delta currents flowing at terminals 20 and 22 are equal. In other words, the currents being conducted from terminal 22 through the first and second current conduction paths are matched by currents being conducted from terminal 20. For instance, briefly referring to FIG. 2, amplifier 28 causes the voltages at terminals 20 and 22 to be matched, and the current conducted from terminal 20 through transistors 42 and 44 compensates for the current being conducted from terminal 22 through transistors 46 and 48. Briefly referring to FIG. 3, by matching the voltages at terminals 20 and 22, the current conducted from terminal 20 through transistors 52 and 54 compensates for the current being conducted from terminal 22 through transistors 56 and 58. Since the delta currents are substantially equal, no differential signal is applied across the input of the amplifier resulting in a very high voltage gain.

Amplifier 28 generates the feedback signal at input 26 of current mirror 24 to adjust the voltage at terminal 20 to substantially match the voltage at terminal 22. Briefly referring to FIG. 1, when the voltage at terminal 22 is greater than the voltage at terminal 20, the feedback signal increases in voltage. Briefly referring to FIG. 3, the feedback signal at terminal 26 having an increased voltage causes transistor 60 to conduct more current through transistor 50.

By now it should be appreciated that the present invention provides a circuit and method for self-correcting an operational amplifier for extending the linear operating range of the amplifier. By providing a feedback signal responsive to a change in voltage at the output (22) of current mirror 24, the voltage at the input (20) of current mirror 24 is made to track and match the former. This matching of voltages enhances the DC gain of the operational amplifier. The static input voltage offset of amplifier 10 is also improved because the feedback signal from amplifier 28 causes the voltages at nodes 20 and 22 to match and track each other even if process variations exists and temperature varies.

What is claimed is:

1. An operational amplifier, comprising:
   a first differential amplifier having inputs coupled for receiving a differential input signal and providing a differential output signal;
   a first current mirror having an input and an output respectively coupled for receiving the differential output signal; and
   an amplifier having first and second inputs coupled for receiving the differential output signal and an output coupled to a control input of the first current mirror to provide common-mode feedback to balance the differential output signal.

2. The operational amplifier of claim 1, wherein the first current mirror comprises:
   a first transistor having a first conduction terminal and a control terminal coupled to the input of the first current mirror and a second conduction terminal coupled to a first power supply conductor;
   a second transistor having a control terminal coupled to a control terminal of the first transistor, a first conduction terminal coupled to the output of the current mirror, and a second conduction terminal coupled to the first power supply conductor; and
   a third transistor having a control terminal coupled to the output of the amplifier, and a first conduction terminal coupled to the control terminals of the first and second transistors, and a second conduction terminal coupled to the first power supply conductor.

3. The operational amplifier of claim 2, wherein the first current mirror further comprises a fourth transistor having a control terminal coupled to the first conduction terminal of the first transistor, a first conduction terminal coupled to a second power supply conductor, and a second conduction terminal coupled to the control terminals of the first and second transistors.

4. The operational amplifier of claim 3, wherein the first current mirror further comprises:
   a fifth transistor having a first conduction terminal coupled to the second conduction terminal of the first transistor, a control terminal coupled to the second power supply, and a second conduction terminal coupled to the first power supply conductor; and
   a sixth transistor having a first conduction terminal coupled to the second conduction terminal of the second transistor, a control terminal coupled to the second power supply, and a second conduction terminal coupled to the first power supply conductor.

5. The operational amplifier of claim 1, wherein the amplifier includes:
   a second differential amplifier having first and second inputs coupled for receiving the differential output signal; and
   an output stage having an input coupled to an output of the second differential amplifier and having an output coupled to the control input of the first current mirror.

6. The operational amplifier of claim 5, wherein the second differential amplifier comprises:
   a first transistor having a first conduction terminal coupled to a first output of the second differential amplifier, and a control terminal coupled to the first input of the second differential amplifier; and
   a second transistor having a first conduction terminal coupled to a second output of the second differential amplifier, a control terminal coupled to the second input of the second differential amplifier, and a second conduction terminal coupled together with a second conduction terminal of the first transistor to a first power supply conductor.

7. The operational amplifier of claim 6, wherein the second differential amplifier further comprises a third transistor having a first conduction terminal coupled to the second conduction terminals of the first and second transistors, a control terminal coupled to a bias source, and a second conduction terminal coupled to the first power supply conductor.

8. The operational amplifier of claim 5, wherein the output stage comprises:
   a first transistor with a first conduction terminal coupled to a first power supply conductor, a control terminal coupled to a bias source, and a second conduction terminal coupled to a first output of the second differential amplifier;
   a second transistor with a first conduction terminal coupled to the first power supply conductor, a control terminal coupled to the bias source, and a second conduction terminal coupled to a second output of the second differential amplifier;
   a third transistor with a first conduction terminal coupled to the first power supply conductor, a control terminal coupled to the bias source, and a second conduction terminal coupled to the output of the amplifier;
   a fourth transistor with a first conduction terminal coupled to the output of the amplifier and a second conduction terminal coupled to a second power supply conductor; and
   a second current mirror having an input coupled to the second conduction terminal of the first transistor and an output coupled to the second conduction terminal of the second transistor and to a control terminal of the fourth transistor.

9. The operational amplifier of claim 8, wherein the output stage further comprises:
   a fifth transistor having a first conduction terminal coupled to the second conduction terminal of the first transistor, a control terminal coupled to the bias source, and a second conduction terminal coupled to the input of the second current mirror; and
   a sixth transistor having a first conduction terminal coupled to the second conduction terminal of the second transistor, a control terminal coupled to the bias source, and a second conduction terminal coupled to the output of the second current mirror.

10. The operational amplifier of claim 8, wherein the second current mirror comprises:
   a first transistor having a first conduction terminal and a control terminal coupled to the input of the second current mirror and a second conduction terminal coupled to the second power supply conductor; and
   a second transistor having a control terminal coupled to the control terminal of the first transistor, a first conduction terminal coupled to the output of the second current mirror, and a second conduction terminal coupled to the second power supply conductor.

11. A signal compensation circuit, comprising:
   a first current mirror having an input and an output respectively coupled for receiving a differential signal; and
   an amplifier having first and second inputs coupled for receiving the differential signal and an output coupled to a control input of the first current mirror to provide common-mode feedback to balance the differential signal.

12. The signal compensation circuit of claim 11, wherein the first current mirror comprises:
   a first transistor having a first conduction terminal and a control terminal coupled to the input of the first current mirror and a second conduction terminal coupled to a first power supply conductor;
   a second transistor having a control terminal coupled to a control terminal of the first transistor, a first conduction terminal coupled to the output of the current mirror, and a second conduction terminal coupled to the first power supply conductor; and
   a third transistor having a control terminal coupled to the output of the amplifier, and a first conduction terminal coupled to the control terminals of the first and second transistors, and a second conduction terminal coupled to the first power supply conductor.

13. The signal compensation circuit of claim 12, wherein the first current mirror further comprises a fourth transistor having a control terminal coupled to the first conduction terminal of the first transistor, a first conduction terminal coupled to a second power supply conductor, and a second conduction terminal coupled to the control terminals of the first and second transistors.

14. The signal compensation circuit of claim 13, wherein the first current mirror further comprises:
   a fifth transistor having a first conduction terminal coupled to the second conduction terminal of the first transistor, a control terminal coupled to the second power supply, and a second conduction terminal coupled to the first power supply conductor; and
   a sixth transistor having a first conduction terminal coupled to the second conduction terminal of the second transistor, a control terminal coupled to the second power supply, and a second conduction terminal coupled to the first power supply conductor.

15. The signal compensation circuit of claim 11, wherein the amplifier includes:
   a second differential amplifier having first and second inputs coupled for receiving the differential output signal; and
   an output stage having an input coupled to an output of the second differential amplifier and having an output coupled to the control input of the first current mirror.

16. The signal compensation circuit of claim 15 wherein the second differential amplifier comprises:
   a first transistor having a first conduction terminal coupled to a first output of the second differential amplifier, and a control terminal coupled to the first input of the second differential amplifier; and
   a second transistor having a first conduction terminal coupled to a second output of the second differential amplifier, a control terminal coupled to the second input of the second differential amplifier, and a second conduction terminal coupled together with a second conduction terminal of the first transistor to a first power supply conductor.

17. The signal compensation circuit of claim 16, wherein the second differential amplifier further comprises a third transistor having a first conduction terminal coupled to the second conduction terminals of the first and second transistors, a control terminal coupled to a bias source, and a second conduction terminal coupled to the first power supply conductor.

18. The signal compensation circuit of claim 15, wherein the output stage comprises:
   a first transistor with a first conduction terminal coupled to a first power supply conductor, a control terminal coupled to a bias source, and a second conduction terminal coupled to a first output of the second differential amplifier;
   a second transistor with a first conduction terminal coupled to the first power supply conductor, a control terminal coupled to the bias source, and a second conduction terminal coupled to a second output of the second differential amplifier;
   a third transistor with a first conduction terminal coupled to the first power supply conductor, a control terminal coupled to the bias source, and a second conduction terminal coupled to the output of the amplifier;
   a fourth transistor with a first conduction terminal coupled to the output of the amplifier and a second conduction terminal coupled to a second power supply conductor; and
   a second current mirror having an input coupled to the second conduction terminal of the first transistor and an output coupled to the second conduction terminal of the second transistor and to a control terminal of the fourth transistor.

19. The signal compensation circuit of claim 18, wherein the output stage further comprises:
   a fifth transistor having a first conduction terminal coupled to the second conduction terminal of the first transistor, a control terminal coupled to the bias source, and a second conduction terminal coupled to the input of the second current mirror; and
   a sixth transistor having a first conduction terminal coupled to the second conduction terminal of the second transistor, a control terminal coupled to the bias source, and a second conduction terminal coupled to the output of the second current mirror.

20. The signal compensation circuit of claim 18, wherein the second current mirror comprises:
   a first transistor having a first conduction terminal and a control terminal coupled to the input of the second current mirror and a second conduction terminal coupled to the second power supply conductor; and
   a second transistor having a control terminal coupled to the control terminal of the first transistor, a first conduction terminal coupled to the output of the second current mirror, and a second conduction terminal coupled to the second power supply conductor.

21. A method of operating a first operational amplifier to provide substantially increased gain, the method comprising providing a compensation signal with a current mirror in response to a decreased gain of a differential signal from an output of a differential amplifier as detected by a second operational amplifier to substantially increase the gain of the first operational amplifier.

22. A method of compensating a first operational amplifier, comprising:

detecting an imbalance in a differential signal with a second operational amplifier; and compensating the differential signal with a current mirror in response to detecting the imbalance of the differential signal to re-establish balance thereof.

23. The method of claim 22, wherein the step of detecting an imbalance in a differential signal includes:

comparing first and second components of the differential signal;

measuring the imbalance of the first and second components of the differential signal; and providing a correction signal in response to the imbalance of the differential signal.

24. The method of claim 23, wherein the step of compensating the differential signal includes adjusting signal levels of the differential signal in response to the correction signal to re-establish balance of the first and second components of the differential signal.

25. A method of reducing gain error in a differential signal, the method comprising:

detecting a gain error in the differential signal with an operational amplifier; and providing a compensation signal with a current mirror in response to the gain error of the differential signal.

26. The method of reducing gain error in a differential signal of claim 25, wherein the method of detecting a gain error in the differential signal comprises:

comparing first and second components of the differential signal;

measuring the gain error of the first and second components of the differential signal; and providing a correction signal in response to the gain error of the differential signal.

27. The method of reducing gain error in a differential signal of claim 25, wherein the method of providing a compensation signal in response to the gain error of the differential signal comprises providing a gain error compensation signal to the source of the differential gain error.

* * * * *

UNITED STATES PATENT AND TRADEMARK OFFICE
CERTIFICATE OF CORRECTION

PATENT NO.    : 6,300,833 B1
DATED         : October 9, 2001
INVENTOR(S)   : Robert L. Vyne and Chad Traylor It is certified that error appears in the above-identified patent and that said Letters Patent is hereby corrected as shown below:

<u>Title page,</u>
Item [22] replace with the following:
-- [22]  Filed: Nov. 26, 1999 --

Signed and Sealed this

Fourteenth Day of May, 2002

*Attest:*

*Attesting Officer*

JAMES E. ROGAN
*Director of the United States Patent and Trademark Office*